(12) United States Patent
Liu

(10) Patent No.: US 12,046,277 B2
(45) Date of Patent: Jul. 23, 2024

(54) COMPILATION METHOD, COMPILATION CIRCUIT, MODE REGISTER, AND MEMORY

(71) Applicant: CHANGXIN MEMORY TECHNOLOGIES, INC., Hefei (CN)

(72) Inventor: Geyan Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 290 days.

(21) Appl. No.: 17/650,543

(22) Filed: Feb. 10, 2022

(65) Prior Publication Data
US 2023/0012747 A1 Jan. 19, 2023

Related U.S. Application Data

(63) Continuation of application No. PCT/CN2021/112827, filed on Aug. 16, 2021.

(30) Foreign Application Priority Data

Jul. 9, 2021 (CN) .......................... 202110777102.4

(51) Int. Cl.
G11C 7/00 (2006.01)
G06F 8/41 (2018.01)
G06F 9/455 (2018.01)
G11C 7/10 (2006.01)
G11C 11/413 (2006.01)

(52) U.S. Cl.
CPC .............. *G11C 11/413* (2013.01); *G06F 8/41* (2013.01); *G06F 9/45516* (2013.01); *G11C 7/109* (2013.01)

(58) Field of Classification Search
CPC ......... G11C 11/413; G11C 7/109; G06F 8/41; G06F 9/45516
See application file for complete search history.

(56) References Cited

U.S. PATENT DOCUMENTS

| | | | |
|---|---|---|---|
| 7,065,000 B2 * | 6/2006 | An ........................... | G11C 8/10 365/230.01 |
| 7,304,906 B2 | 12/2007 | Ha | |
| 7,821,846 B2 * | 10/2010 | Yoon .................... | G11C 7/1045 365/189.12 |
| 9,170,901 B2 * | 10/2015 | Bailey ...................... | G06F 11/25 |
| 11,599,139 B1 * | 3/2023 | Zhu .......................... | G06F 1/08 |
| 2023/0009877 A1 * | 1/2023 | Lu ........................ | G11C 11/4085 |
| 2023/0014084 A1 * | 1/2023 | Liu ...................... | G11C 11/4063 |
| 2023/0017826 A1 * | 1/2023 | Lu ....................... | G11C 11/40603 |

* cited by examiner

*Primary Examiner* — Viet Q Nguyen
(74) *Attorney, Agent, or Firm* — Syncoda LLC; Feng Ma

(57) ABSTRACT

A compilation method includes: receiving a signal to be compiled and a working frequency signal; performing compilation processing on the signal to be compiled to obtain a compilation result signal; and if the signal to be compiled is a reserved code, performing compatibility selection processing on the compilation result signal based on the working frequency signal to determine a first compilation value.

20 Claims, 6 Drawing Sheets ns
COMPILATION METHOD, COMPILATION CIRCUIT, MODE REGISTER, AND MEMORY

CROSS-REFERENCE TO RELATED APPLICATIONS

This is a continuation of International Application No. PCT/CN2021/112827 filed on Aug. 16, 2021, which claims priority to Chinese Patent Application No. 202110777102.4 filed on Jul. 9, 2021. The disclosures of these applications are hereby incorporated by reference in their entirety.

BACKGROUND

A mode register is an important component of a Dynamic Random Access Memory (DRAM), and is mainly used to set related parameters of a DRAM. Specifically, there are multiple input bits (also called input codes or address codes) in each mode register, and the level states of different input bits correspond to different parameter values after decoding.

SUMMARY

This disclosure relates to, but is not limited to, a compilation method, a compilation circuit, a mode register, and a memory.

In a first aspect, the embodiments of the disclosure provide a compilation method, applied to a compilation circuit, which includes the following operations.

A signal to be compiled and a working frequency signal are received.

Compilation processing is performed on the signal to be compiled to obtain a compilation result signal.

If the signal to be compiled is a reserved code, compatibility selection processing is performed on the compilation result signal based on the working frequency signal to determine a first compilation value.

In a second aspect, the embodiments of the disclosure provide a compilation circuit, which includes a signal input end, a compilation unit and a compatibility selection unit.

The signal input end is configured to receive a signal to be compiled and a working frequency signal.

The compilation unit is configured to perform compilation processing on the signal to be compiled to obtain a compilation result signal.

The compatibility selection unit is configured to, if the signal to be compiled is a reserved code, perform compatibility selection processing on the compilation result signal based on the working frequency signal to determine a first compilation value.

In a third aspect, the embodiments of the disclosure provide a mode register, which includes at least a compilation circuit of the second aspect.

In a fourth aspect, the embodiments of the disclosure provide a memory, which includes at least a mode register of the third aspect.

DETAILED DESCRIPTION

Figure 1:
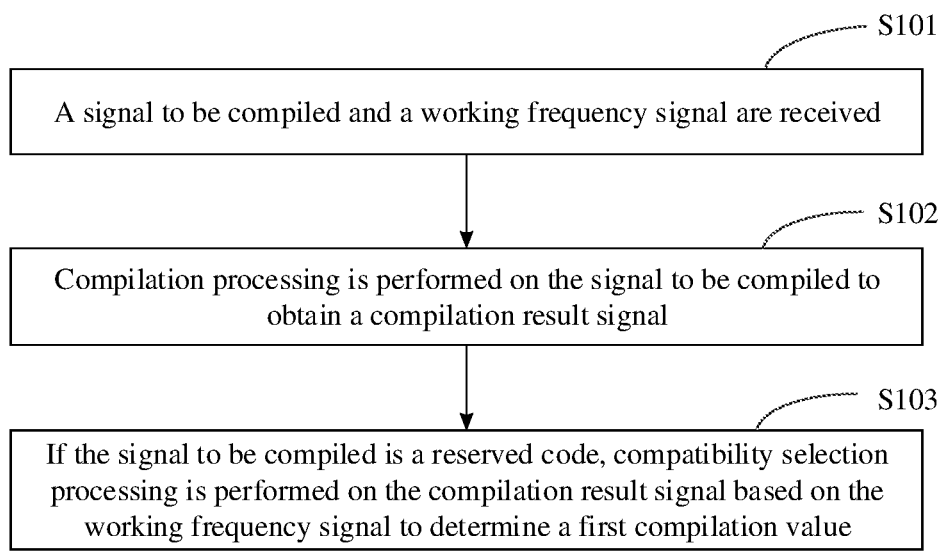
FIG. 1 is a schematic flowchart of a compilation method provided by the embodiments of the disclosure.

The embodiments of the disclosure will be clearly and completely described below in combination with the accompanying drawings in the embodiments of the disclosure. It can be understood that the specific embodiments described here are only used to explain the disclosure, but not to limit the disclosure. In addition, it should also be noted that, for ease of description, only the parts related to the disclosure are shown in the drawings.

Unless otherwise defined, all technical and scientific terms used herein have the same meanings as those commonly understood by those skilled in the art to which the disclosure pertains. The terms used herein are only for the purpose of describing embodiments of the disclosure and are not intended to limit the disclosure.

In the following description, reference is made to "some embodiments", which describe a subset of all possible embodiments, but it can be understood that "some embodiments" may be the same or different subsets of all possible embodiments and may be combined with each other without conflict.

It should be noted that the term "first/second/third" involved in the embodiments of this application is only used to distinguish similar objects and does not represent a specific order for objects. It can be understood that "first/second/third" can be interchanged in a specific order or sequence if allowed, so that the embodiments of the disclosure described here can be implemented in an order other than those illustrated or described here.

A mode register has poor compatibility with different application platforms, which brings inconvenience to the application of DRAM.

There are multiple mode registers in a DRAM, which are used to set different functions and working modes of the DRAM. Specifically, there are multiple input bits (also called address codes, address bits, etc.) in each mode register. The level states of different input bits constitute a signal to be compiled. The signal to be compiled is decoded to determine corresponding parameter values.

During practical applications, a user sends a mode register set command (MRS Command) to a DRAM through a DRAM controller, so as to set each mode register. In particular, since Basic Input Output Systems (BIOS s) in different DRAM controllers have different related settings, the mode registers provide different optional parameters to match a variety of application platforms.

At present, in the SPEC part of the technical specification of the fourth generation of Double Data Rate SDRAM (DDR SDRAM) (DDR4), compilation rules between input bit combinations and parameter values in a mode register are defined. Here, in addition to some clearly defined input bit combinations, there are also some input bit combinations that are not enabled, namely reserved codes (Reserved), for designers to use in response to special requirements.

In general, in most cases without special requirements, reserved codes are not enabled. Accordingly, there is no compilation circuit for these reserved codes in the DRAM. However, since a DRAM controller may be required to test and control a variety of DRAMs and is not designed for a single DRAM, the DRAM controller may issue control commands involving reserved codes. Consequently, for some DRAMs having no reserved code-related compilation circuits, if a reserved code issued by the DRAM controller is received, the mode register cannot work at all, thereby reducing the compatibility of the mode register with different application platforms.

Specifically, according to the provisions of DDR4, there are 6 setting items related to external working frequencies in a mode register, which are: (1) TWR&TPTP setting item, see Table 1; (2) CAS Latency setting item, see Table 2; (3) CS to CMD/ADDR Latency setting item, see Table 3; (4) CRC+DM Write Command Latency setting item, see Table 4; (5) C/A Parity Latency setting item, see Table 5; and (6) tCCDL/tDLLK setting item, see Table 6. It can be seen from Tables 1 to 6 that each specific setting item has a reserved code (Reserved).

For example, in a test platform of a company, if a DRAM controller uses a reserved code in the tCCDL setting item to perform a low-speed test on DRAM, since there is no compilation circuit for the reserved code in tCCDL in the mode register in the DRAM, the overall test cannot be started.

TABLE 1

| A13 | A11 | A10 | A9 | WR | RTP |
|---|---|---|---|---|---|
| 0 | 0 | 0 | 0 | 10 | 5 |
| 0 | 0 | 0 | 1 | 12 | 6 |
| 0 | 0 | 1 | 0 | 14 | 7 |
| 0 | 0 | 1 | 1 | 16 | 8 |
| 0 | 1 | 0 | 0 | 18 | 9 |
| 0 | 1 | 0 | 1 | 20 | 10 |
| 0 | 1 | 1 | 0 | 24 | 12 |
| 0 | 1 | 1 | 1 | 22 | 11 |
| 1 | 0 | 0 | 0 | 26 | 13 |
| 1 | 0 | 0 | 1 | Reserved | Reserved |
| 1 | 0 | 1 | 0 | Reserved | Reserved |
| 1 | 0 | 1 | 1 | Reserved | Reserved |
| 1 | 1 | 0 | 0 | Reserved | Reserved |
| 1 | 1 | 0 | 1 | Reserved | Reserved |
| 1 | 1 | 1 | 0 | Reserved | Reserved |
| 1 | 1 | 1 | 1 | Reserved | Reserved |

TABLE 2

| A12 | A6 | A5 | A4 | A2 | CAS Latency |
|---|---|---|---|---|---|
| 0 | 0 | 0 | 0 | 0 | 9 |
| 0 | 0 | 0 | 0 | 1 | 10 |
| 0 | 0 | 0 | 1 | 0 | 11 |
| 0 | 0 | 0 | 1 | 1 | 12 |
| 0 | 0 | 1 | 0 | 0 | 13 |
| 0 | 0 | 1 | 0 | 1 | 14 |
| 0 | 0 | 1 | 1 | 0 | 15 |
| 0 | 0 | 1 | 1 | 1 | 16 |

TABLE 2-continued

| A12 | A6 | A5 | A4 | A2 | CAS Latency |
|---|---|---|---|---|---|
| 0 | 1 | 0 | 0 | 0 | 18 |
| 0 | 1 | 0 | 0 | 1 | 20 |
| 0 | 1 | 0 | 1 | 0 | 22 |
| 0 | 1 | 0 | 1 | 1 | 24 |
| 0 | 1 | 1 | 0 | 0 | 23 |
| 0 | 1 | 1 | 0 | 1 | 17 |
| 0 | 1 | 1 | 1 | 0 | 19 |
| 0 | 1 | 1 | 1 | 1 | 21 |
| 1 | 0 | 0 | 0 | 0 | 25 |
| 1 | 0 | 0 | 0 | 1 | 26 |
| 1 | 0 | 0 | 1 | 0 | 27 (only 36DS available) |
| 1 | 0 | 0 | 1 | 1 | 28 |
| 1 | 0 | 1 | 0 | 0 | Reserved for 29 |
| 1 | 0 | 1 | 0 | 1 | 30 |
| 1 | 0 | 1 | 1 | 0 | Reserved for 31 |
| 1 | 0 | 1 | 1 | 1 | 32 |
| 1 | 1 | 0 | 0 | 0 | Reserved |

TABLE 3

| A8 | A7 | A6 | CAL |
|---|---|---|---|
| 0 | 0 | 0 | Disable |
| 0 | 0 | 1 | 3 |
| 0 | 1 | 0 | 4 |
| 0 | 1 | 1 | 5 |
| 1 | 0 | 0 | 6 |
| 1 | 0 | 1 | 8 |
| 1 | 1 | 0 | Reserved |
| 1 | 1 | 1 | Reserved |

TABLE 4

| A10 | A9 | CRC + DM Write Command Latency | Operating Data Rate |
|---|---|---|---|
| 0 | 0 | 4nCK | 1600 |
| 0 | 1 | 5nCK | 1866, 2133, 2400, 2666 |
| 1 | 0 | 6nCK | 2933, 3200 |
| 1 | 1 | RFU | RFU |

TABLE 5

| A2 | A1 | A0 | PL | Speed Bin |
|---|---|---|---|---|
| 0 | 0 | 0 | Disable | |
| 0 | 0 | 1 | 4 | 1600, 1866, 2133 |
| 0 | 1 | 0 | 5 | 2400, 2666 |
| 0 | 1 | 1 | 6 | 2933, 3200 |
| 1 | 0 | 0 | 8 | RFU |
| 1 | 0 | 1 | Reserved | |
| 1 | 1 | 0 | Reserved | |
| 1 | 1 | 1 | Reserved | |

TABLE 6

| A12 | A11 | A10 | TCCD_L min (nCK)[1] | tDLLKmin (nCK)[1] | Note |
|---|---|---|---|---|---|
| 0 | 0 | 0 | 4 | 597 | Data rate < 1333 Mbps |
| 0 | 0 | 1 | 5 | | 1333 Mbps < Data rate ≤ 1866 Mbps (1600/1866 Mbps) |
| 0 | 1 | 0 | 6 | 768 | 1866 Mbps < Data rate ≤ 2400 Mbps (2133/2400 Mbps) |
| 0 | 1 | 1 | 7 | 1024 | 2400 Mbps < Data rate ≤ 2666 Mbps (2666 Mbps) |

TABLE 6-continued

| A12 | A11 | A10 | TCCD_L min (nCK)[1] | tDLLKmin (nCK)[1] | Note |
|---|---|---|---|---|---|
| 1 | 0 | 0 | 8 | | 2666 Mbps < Data rate ≤ 3200 Mbps (2933/3200 Mbps) |
| 1 | 0 | 1 | Reserved | | |
| 1 | 1 | 0 | | | |
| 1 | 1 | 1 | | | |

In particular, Tables 1 to 6 are all from the SPEC part of DRAM DDR4. A1, A2, . . . , A12 are bits in a corresponding mode register. The meanings of other related parameters may be found in the DDR4 file and do not affect the understanding of the embodiments of the disclosure, and thus will not be described in detail here.

Based on this, the embodiments of the disclosure provide a compilation method, the basic idea of which is: receiving a signal to be compiled and a working frequency signal; performing compilation processing on the signal to be compiled to obtain a compilation result signal; and if the signal to be compiled is a reserved code, performing compatibility selection processing on the compilation result signal based on the working frequency signal to determine a first compilation value. In this way, by presetting compilation rules for reserved codes, a mode register can compile a reserved code sent by an application platform, so as to that the mode register cannot work after receiving the reserved code. In addition, according to different working frequency signals, compilation results of the reserved code are different, so that the mode register can better match application platforms having different working frequencies, finally improving the compatibility of the mode register with different application platforms.

The embodiments of the disclosure will be described in detail below in combination with the accompanying drawings.

In an embodiment of the disclosure, referring to FIG. 1, a schematic flowchart of a compilation method provided by the embodiments of the disclosure is shown. As shown in FIG. 1, the method may include the following operations.

At S101, a signal to be compiled and a working frequency signal are received.

It should be noted that the compilation method provided in the embodiments of the disclosure is applied to a mode register of a DRAM.

In order to match the BIOS setting of a DRAM controller, a mode register of a DRAM provides some adjustable parameters, so that the DRAM controller may send an MRS command to the DRAM to set the mode register in the DRAM. The compilation method provided in the embodiments of the disclosure is specifically applied to a compilation circuit for adjustable parameters in a mode register in a DRAM.

In general, the working frequencies of different DRAM controllers may be different. Therefore, there are some setting items used to match a working frequency in a mode register, such as TWR&TPTP setting item, CAS Latency setting item, CS to CMD/ADDR Latency setting item, CRC+DM Write Command Latency setting item, C/A Parity Latency setting item, and tCCDL/tDLLK setting item. In general, there are multiple optional parameter values in each specific setting item to facilitate matching DRAM controllers having different working frequencies.

For these setting items, there are multiple input bits in the mode register. Detailed encoding rules have been defined for DDR4, such as specific input bit combinations and compilation values corresponding to the input bit combinations. These clearly defined input bit combinations are generally called control codes (or non-reserved codes). In addition, there are some input bit combinations that are not enabled in DDR4, that is, DDR4 does not define compilation values corresponding to these input bit combinations, and these input bit combinations are generally called reserved codes.

In the some implementations, due to the lack of a compilation circuit for a reserved code in the hardware system of a mode register, the mode register cannot work if a related command involving the reserved code is received. In view of the above, the embodiments of the disclosure provide a compilation method, which allows a reserved code in a setting item related to an external working frequency to be encoded and decoded in advance, so as to be more compatible with different DRAM controllers.

For the compilation method provided by the embodiments of the disclosure, a signal to be compiled and a working frequency signal need to be received. The frequency signal is used to indicate whether the working frequency of a DRAM controller is high or low frequency.

At S102, compilation processing is performed on the signal to be compiled to obtain a compilation result signal.

It should be noted that compilation processing is performed on the signal to be compiled to obtain a compilation result signal.

Here, the hardware of the compilation circuit is improved, that is, a compilation part for a reserved code is designed in advance in the compilation circuit. Therefore, even if the signal to be compiled is a reserved code, a compilation result signal may also be obtained without causing a direct downtime of the DRAM.

At S103, if the signal to be compiled is a reserved code, compatibility selection processing is performed on the compilation result signal based on the working frequency signal to determine a first compilation value.

It should be noted that there are multiple setting items with different functions in a mode register, and each setting item may have a reserved code. Moreover, the reserved code in the embodiments of the disclosure particularly relates to setting items related to the working frequency of a DRAM controller, such as a TWR&TRTP reserved code, a CAS Latency reserved code, a CS to CMD/ADDR Latency reserved code, a CRC+DM Write Command Latency reserved code, a C/AParity Latency reserved code, or a tCCDL/tDLLK reserved code.

Since the specific parameter values of these setting items are related to the working frequency of the DRAM controller, a first compilation value needs to be determined according to the working frequency signal if the signal to be compiled is a reserved code, so as to better match the working frequency of the DRAM controller. In other words, as long as the signal to be compiled is a reserved code, a final compilation value will be determined according to the working frequency signal, rather than according to the reserved code itself.

Specifically, the compilation value of the reserved code may be different according to the working frequency signal. Therefore, in some embodiments, the performance of compatibility selection processing on the compilation result signal based on the working frequency signal to determine a first compilation value may include the following operations.

It is determined that the first compilation value is a first preset value if the working frequency signal is a first level signal.

It is determined that the first compilation value is a second preset value if the working frequency signal is a second level signal.

It should be noted that it is determined that the first compilation value is a first preset value if the working frequency signal is a first level signal, and it is determined that the first compilation value is a second preset value if the working frequency signal is a second level signal.

Here, the first level signal and the second level signal are different level states. For example, the first level signal may be a high level signal, and is also represented by "1"; the second level signal may be a low level signal, and is also represented by "0". Specifically, the level state of the working frequency signal may indicate the magnitude of the external working frequency. For example, the low level signal may be used to indicate a high-frequency DRAM controller, and the high level signal may be used to indicate a low-frequency DRAM controller. In addition, the first preset value is different from the second preset value.

In this way, it may be determined that the first compilation value is a first preset value or a second preset value according to the working frequency signal if the signal to be compiled is a reserved code, so as to match the working frequencies of different DRAM controllers.

Further, in some embodiments, if the signal to be compiled is a non-reserved code, the method may further include the following operation.

A second compilation value is determined according to the compilation result signal.

It should be noted that for a non-reserved code clearly defined by JEDEC DDR4 SPEC, a second compilation value may be directly determined according to the compilation result signal.

It should be understood that for a non-reserved code, the compilation value needs to be determined according to the content of the non-reserved code itself, and for a reserved code, the compilation value needs to be determined according to the working frequency signal.

The compilation method is further described below in combination with a specific compilation circuit structure.

In some embodiments, the compilation circuit may include a first compilation unit, a second compilation unit, and a compatibility selection unit. The method may further include the following operations.

If the signal to be compiled is a reserved code, the first compilation value is determined by means of the first compilation unit and the compatibility selection unit.

If the signal to be compiled is a non-reserved code, the second compilation value is determined by means of the second compilation unit.

It should be noted that the compilation circuit may be divided into a first compilation unit, and a second compilation unit, and a compatibility selection unit. The first compilation unit is a unit for compiling a reserved code. Since the compilation value of a reserved code needs to be determined depending on the working frequency signal, the first compilation value is determined by the first compilation unit and the compatibility selection unit if the signal to be compiled is a reserved code. The second compilation unit is a unit for compiling a non-reserved code. The second compilation value is directly determined by the second compilation unit if the signal to be compiled is a non-reserved code.

It should also be noted that for each non-reserved code, DDR4 clearly defines its compilation value, while a reserved code is essentially an input bit combination that is not enabled and whose compilation value is not defined by DDR4. In order to save circuit area, compilation values of some non-reserved codes may be reused as compilation values of reserved codes. Therefore, in some embodiments, the second compilation value includes n compilation values, and n is a positive integer. The method may further include the following operations.

A maximum value is selected from the n compilation values, and the maximum value is determined as the first preset value.

A minimum value is selected from the n compilation values, and the minimum value is determined as the second preset value.

It should be noted that for one specific setting item, there may be several non-reserved codes for the setting item, which respectively correspond to different compilation values and are used to indicate several different working modes to match DRAM controllers having different working frequencies. Then, the maximum value in these compilation values may be determined as the first preset value, and the minimum value in these compilation values may be determined as the second preset value.

In particular, both the first compilation value and the second compilation value relate to the compilation circuit of the same setting item. In other words, when the specific value for the first compilation value is designed, a selection may be made from the second compilation value corresponding to the non-reserved code of the same setting item corresponding to the reserved code.

Taking the above-mentioned six setting items related to working frequency as an example, one specific compilation scheme provided by the embodiments of the disclosure is given: (1) TWR & TPTP setting item, see Table 7; (2) CAS Latency setting item, see Table 8; (3) CS to CMD/ADDR Latency setting item, see Table 9; (4) CRC+DM Write Command Latency setting item, see Table 10; (5) C/A Parity Latency setting item, see Table 11; and (6) tCCDL/tDLLK setting item, see Table 12. In particular, in Tables 7 to 12, the bold parts show the compilation values of the reserved codes. For each reserved code, there are two specific values (equivalent to the above-mentioned first preset value and the above-mentioned second preset value). In practical applications, the specific compilation value of the reserved code needs to be determined according to the working frequency signal.

TABLE 7

| A13 | A11 | A10 | A9 | WR | RTP |
|---|---|---|---|---|---|
| 0 | 0 | 0 | 0 | 10 | 5 |
| 0 | 0 | 0 | 1 | 12 | 6 |
| 0 | 0 | 1 | 0 | 14 | 7 |
| 0 | 0 | 1 | 1 | 16 | 8 |
| 0 | 1 | 0 | 0 | 18 | 9 |

TABLE 7-continued

| A13 | A11 | A10 | A9 | WR | RTP |
|---|---|---|---|---|---|
| 0 | 1 | 0 | 1 | 20 | 10 |
| 0 | 1 | 1 | 0 | 24 | 12 |
| 0 | 1 | 1 | 1 | 22 | 11 |
| 1 | 0 | 0 | 0 | 26 | 13 |
| 1 | 0 | 0 | 1 | 26/10 | 13/5 |
| 1 | 0 | 1 | 0 | 26/10 | 13/5 |
| 1 | 0 | 1 | 1 | 26/10 | 13/5 |
| 1 | 1 | 0 | 0 | 26/10 | 13/5 |
| 1 | 1 | 0 | 1 | 26/10 | 13/5 |
| 1 | 1 | 1 | 0 | 26/10 | 13/5 |
| 1 | 1 | 1 | 1 | 26/10 | 13/5 |

TABLE 8

| A12 | A6 | A5 | A4 | A2 | CAS Latency |
|---|---|---|---|---|---|
| 0 | 0 | 0 | 0 | 0 | 9 |
| 0 | 0 | 0 | 0 | 1 | 10 |
| 0 | 0 | 0 | 1 | 0 | 11 |
| 0 | 0 | 0 | 1 | 1 | 12 |
| 0 | 0 | 1 | 0 | 0 | 13 |
| 0 | 0 | 1 | 0 | 1 | 14 |
| 0 | 0 | 1 | 1 | 0 | 15 |
| 0 | 0 | 1 | 1 | 1 | 16 |
| 0 | 1 | 0 | 0 | 0 | 18 |
| 0 | 1 | 0 | 0 | 1 | 20 |
| 0 | 1 | 0 | 1 | 0 | 22 |
| 0 | 1 | 0 | 1 | 1 | 24 |
| 0 | 1 | 1 | 0 | 0 | 23 |
| 0 | 1 | 1 | 0 | 1 | 17 |
| 0 | 1 | 1 | 1 | 0 | 19 |
| 0 | 1 | 1 | 1 | 1 | 21 |
| 1 | 0 | 0 | 0 | 0 | 25 |
| 1 | 0 | 0 | 0 | 1 | 26 |
| 1 | 0 | 0 | 1 | 0 | 27 (only 3DS available) |
| 1 | 0 | 0 | 1 | 1 | 28 |
| 1 | 0 | 1 | 0 | 0 | reserved for 29 |
| 1 | 0 | 1 | 0 | 1 | 30 |
| 1 | 0 | 1 | 1 | 0 | reserved for 31 |
| 1 | 0 | 1 | 1 | 1 | 32 |
| 1 | 1 | 0 | 0 | 0 | 32/9 |

TABLE 9

| A8 | A7 | A6 | CAL |
|---|---|---|---|
| 0 | 0 | 0 | Disable |
| 0 | 0 | 1 | 3 |
| 0 | 1 | 0 | 4 |
| 0 | 1 | 1 | 5 |
| 1 | 0 | 0 | 6 |

TABLE 9-continued

| A8 | A7 | A6 | CAL |
|---|---|---|---|
| 1 | 0 | 1 | 8 |
| 1 | 1 | 0 | 8/3 |
| 1 | 1 | 1 | 8/3 |

TABLE 10

| A10 | A9 | CRC + DM Write Command Latency | Operating Data Rate |
|---|---|---|---|
| 0 | 0 | 4nCK | 1600 |
| 0 | 1 | 5nCK | 1866, 2133, 2400, 2666 |
| 1 | 0 | 6nCK | 2933, 3200 |
| 1 | 1 | 6/4 | RFU |

TABLE 11

| A2 | A1 | A0 | PL | Speed Bin |
|---|---|---|---|---|
| 0 | 0 | 0 | Disable | |
| 0 | 0 | 1 | 4 | 1600, 1866, 2133 |
| 0 | 1 | 0 | 5 | 2400, 2666 |
| 0 | 1 | 1 | 6 | 2933, 3200 |
| 1 | 0 | 0 | 8 | RFU |
| 1 | 0 | 1 | 6/4 | |
| 1 | 1 | 0 | 6/4 | |
| 1 | 1 | 1 | 6/4 | |

TABLE 12

| A12 | A11 | A10 | TCCD_L min (nCK)[1] | tDLLK min (nCK)[1] | Note |
|---|---|---|---|---|---|
| 0 | 0 | 0 | 4 | 597 | Data rate ≤ 1333 Mbps |
| 0 | 0 | 1 | 5 | | 1333 Mbps < Data rate ≤ 1866 Mbps (1600/1866 Mbps) |
| 0 | 1 | 0 | 6 | 768 | 1866 Mbps < Data rate ≤ 2400 Mbps (2133/2400 Mbps) |
| 0 | 1 | 1 | 7 | 1024 | 2400 Mbps < Data rate ≤ 2666 Mbps (2666 Mbps) |
| 1 | 0 | 0 | 8 | | 2666 Mbps < Data rate ≤ 3200 Mbps (2933/3200 Mbps) |
| 1 | 0 | 1 | 8/4 | | |
| 1 | 1 | 0 | | | |
| 1 | 1 | 1 | | | |

As shown in Table 8, for the CAS Latency setting item, compilation values of non-reserved codes include multiple values from 9 to 32. In this case, for a reserved code of the CAS Latency setting item, it may be determined that the first compilation value is 9 or 32. In particular, for the TWR&TPTP setting item, as shown in Table 7, the compilation value of each non-reserved code actually contains two parameters, namely a WR parameter and a RTP parameter. The compilation values of non-reserved codes include multiple combination values between (WR: 10, RTP: 5) and (WR: 26, RTP: 13). Similarly, the extreme values in the second compilation values may still be selected for the first compilation value, i.e., (WR: 10, RTP: 5) and (WR: 26, RTP: 13).

The benefits of this include: (1) the maximum value and the minimum value may correspond to relatively extreme external working frequencies, ensuring that a DRAM may work normally in a DRAM controller having a high working frequency or a DRAM controller having a low working frequency; and (2) the compilation value of a non-reserved code is reused as the compilation value of a reserved code, and thus, in the process of circuit design, some circuits and output ends may be reused, saving the layout area of an integrated circuit.

It should be understood that the above is only one way to determine the first compilation value, and does not constitute a limitation on the embodiments of the disclosure.

Further, in some embodiments, the method may further include the following operation.

A first-type non-reserved code and a second-type non-reserved code are determined. The first-type non-reserved code includes non-reserved codes corresponding to the maximum value and the minimum value respectively, and the second-type non-reserved code includes a remaining non-reserved code in the non-reserved code other than the first-type non-reserved code.

Correspondingly, the compilation circuit includes a first compilation unit, a second compilation unit and a compatibility selection unit, and the second compilation unit includes a second alpha compilation unit and a second beta compilation unit. The method may further include the following operations.

If the signal to be compiled is a reserved code or a first-type non-reserved code, the first compilation value is determined by means of the first compilation unit, the second alpha compilation unit, and the compatibility selection unit.

If the signal to be compiled is a second-type non-reserved code, a third compilation value is determined by means of the second beta compilation unit. The third compilation value is the remaining compilation value of the second compilation value other than the first compilation value.

It should be noted that in order to implement circuit reuse, the non-reserved code is classified into a first-type non-reserved code and a second-type non-reserved code. The first-type non-reserved code includes reserved codes corresponding to the above-mentioned maximum value and the above-mentioned minimum value respectively, and the second-type non-reserved code includes non-reserved codes other than the first-type non-reserved code.

Correspondingly, the second compilation value may also be classified into a first compilation value and a third compilation value. The first compilation value includes the above-mentioned maximum value and the above-mentioned minimum value, and the third compilation value refers to the remaining compilation value of the second compilation value other than the first compilation value.

On this basis, the second compilation unit is divided into a second alpha compilation unit and a second beta compilation unit. The second alpha compilation unit is configured to perform compilation on the first-type non-reserved code, and the second beta compilation unit is configured to perform compilation on the second-type non-reserved code. In this case, the compilation process may specifically include the following operations.

For a reserved code or a first-type non-reserved code, the first compilation value is determined by means of the first compilation unit, the second alpha compilation unit and the compatibility selection unit; and for a second-type non-reserved code, the third compilation value is directly determined by means of the second beta compilation unit.

In this way, some of compilation circuits and output ends for the first-type non-reserved code are reused for the compilation circuit for the reserved code, which can save the circuit area.

Further, in some embodiments, the determination of the first compilation value by means of the first compilation unit, the second alpha compilation unit and the compatibility selection unit may include the following operations Compilation processing is performed on the signal to be compiled by means of the first compilation unit, to obtain a first compilation processing signal.

Compilation processing is performed on the signal to be compiled by means of the second alpha compilation unit, to obtain a second alpha compilation processing signal.

Logical calculation is performed on the first compilation processing signal, the second alpha compilation processing signal and the working frequency signal by means of the compatibility selection unit, and the first compilation value is determined according to the logical calculation result.

It should be noted that an example of a circuit processing process for determining the first compilation value is as follows.

(1) A first compilation signal can be obtained by performing compilation processing by the first compilation unit on the signal to be compiled. Here, the first compilation signal may indicate whether the signal to be compiled is a reserved code (because the compilation value of a reserved code is only determined according to the working frequency signal).

(2) A second alpha compilation signal can be obtained by performing compilation processing by the second alpha compilation unit on the signal to be compiled. Here, the second alpha compilation signal may not only indicate whether the signal to be compiled is a first-type non-reserved code, but also needs to indicate which first-type non-reserved code it is (because the compilation value of a non-reserved code needs to be determined according to the non-reserved code).

(3) Logical calculation is performed on the first compilation signal, the second compilation signal I, and the working frequency signal, and a specific value is determined according to the logical calculation result. Here, the algorithm of logical calculation needs to be designed according to different application scenarios.

In this way, through the compilation method provided in the embodiments of the disclosure, both a reserved code and a non-reserved code can be decoded, and even if an instruction regarding a reserved code is received, a DRAM may still work normally without downtime. In addition, for a reserved code, the final compilation value needs to be determined according to a working frequency signal, so that the DRAM may match DRAM controllers having different working frequencies, finally improving the compatibility of the DRAM.

In summary, the embodiments of the disclosure relate to the field of design of Synchronous Dynamic Random Access Memory (SDRAM) DDR4, and are specifically applied to a mode register in a DRAM. In JEDEC DDR4 SPEC of the latest version, there are still definitions of reserved codes for mode settings related to working frequencies for some mode registers. These reserved codes are also available setting codes for different design schemes of DRAM controller.

Therefore, in different DRAM controller design schemes, reserved codes may be applied to different encoding and speed environments, resulting in that some DRAMs cannot be compatible with DRAM controllers. In order to improve the compatibility of a DDR4 circuit with more DRAM controller design schemes, these reserved codes may be encoded and decoded in advance in the design of DRAMs.

That is, the objective of the embodiments of the disclosure is to improve the system compatibility of DDR4 with DRAM controllers. Specifically, in order to better adapt to the use of reserved codes in a DRAM in the design schemes of different DRAM controllers, the settings of six mode setting reserved codes related to speed (i.e., working frequency) are compiled in advance in DDR4 design, so as to further improve the compatibility with different system platforms.

Specifically, the six mode setting items respectively include: a TWR&TPTP reserved code, a CAS Latency reserved code, a CS to CMD/ADDR Latency reserved code, a CRC+DM Write Command Latency reserved code, a C/A Parity Latency reserved code, or a tCCDL/tDLLK reserved code. Reserved codes are set for the above six speed-related modes, and their compilation values may correspond to a high-frequency setting or a low-frequency setting at the same time. The final decision on the corresponding high-frequency setting or low-frequency setting may be selected by the compatibility selection circuit (or Design For Test circuit) according to different controller use environments, so as to further improve the compatibility with different system platforms. As shown in Tables 7 to 12, the embodiments of the disclosure provide a possible encoding setting for reserved codes, in which a larger value represents encoding adapted to a high-frequency environment and a smaller value represents encoding adapted to a low-frequency environment.

In this way, by presetting frequency- and speed-related reserved codes defined in different mode registers in DDR4 JEDEC SPEC, better compatibility with the BIOS settings of different DRAM controllers may be achieved.

The embodiments of the disclosure provide a compilation method, which includes: receiving a signal to be compiled and a working frequency signal; performing compilation processing on the signal to be compiled to obtain a compilation result signal; and if the signal to be compiled is a reserved code, performing compatibility selection processing on the compilation result signal based on the working frequency signal to determine a first compilation value. In this way, by presetting compilation rules for reserved codes, a mode register can compile a reserved code sent by an application platform, so as to avoid that the mode register cannot work after receiving the reserved code. In addition, according to different working frequency signals, compilation results of the reserved code are different, so that the mode register can better match application platforms having different working frequencies, finally improving the compatibility of the mode register with different application platforms.

Figure 2:
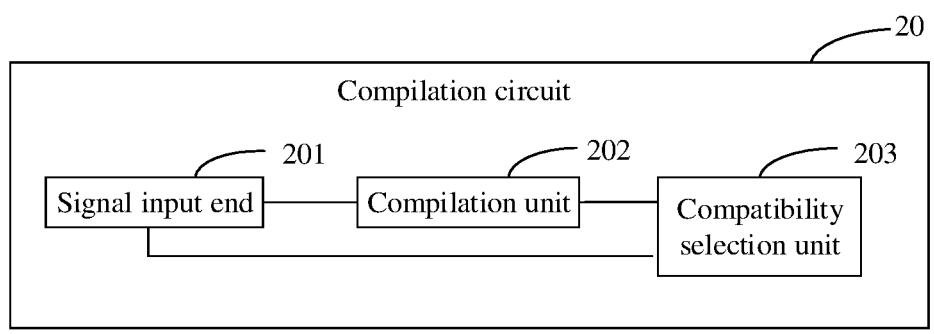
FIG. 2 is a schematic structural diagram of a compilation circuit provided by the embodiments of the disclosure.

In another embodiment of the disclosure, referring to FIG. 2, a schematic structural diagram of a compilation circuit 20 provided by the embodiments of the disclosure is shown. As shown in FIG. 2, the compilation circuit 20 includes a signal input end 201, a compilation unit 202 and a compatibility selection unit 203.

The signal input end 201 is configured to receive a signal to be compiled and a working frequency signal.

The compilation unit 202 is configured to perform compilation processing on the signal to be compiled to obtain a compilation result signal.

The compatibility selection unit 203 is configured to, if the signal to be compiled is a reserved code, perform compatibility selection processing on the compilation result signal based on the working frequency signal to determine a first compilation value.

It should be noted that, as shown in FIG. 2, the compilation circuit 20 includes a signal input end 201, a compilation unit, and a compatibility selection unit 203. The signal input end 201 is configured to receive a signal to be compiled and a working frequency signal. The compilation unit 202 is configured to perform compilation processing on the signal to be compiled to output a compilation result signal. The compatibility selection unit 203, which is connected to both the compilation unit 202 and the signal input end 201, is configured to, if the signal to be compiled is a reserved code, perform compatibility selection processing on the compilation result signal according to the working frequency signal to obtain a first compilation value.

Here, the reserved code at least includes one of: a TWR&TRTP reserved code, a CAS Latency reserved code, a CS to CMD/ADDR Latency reserved code, a CRC+DM Write Command Latency reserved code, a C/A Parity Latency reserved code, or a tCCDL/tDLLK reserved code.

Further, in some embodiments, the compatibility selection unit 203 is specifically configured to: determine that the first compilation value is a first preset value if the signal to be compiled is a reserved code and the working frequency signal is a first level signal; and determine that the first compilation value is a second preset value if the signal to be compiled is a reserved code and the working frequency signal is a second level signal. The first level signal is different from the second level signal, and the first preset value is different from the second preset value.

It should be noted that for a reserved code, the compatibility selection unit 203 determines that the first compilation value is a first preset value if the working frequency signal is a first level signal, and the compatibility selection unit 203 determines that the first compilation value is a second preset value if the working frequency signal is a second level signal. The first level signal may be designed as a low level signal, and the second level signal may be designed as a high level signal.

Further, in some embodiments, the compilation circuit 20 is further configured to determine a second compilation value according to the compilation result signal if the signal to be compiled is a non-reserved code.

It should be noted that for a non-reserved code, the compilation circuit 20 directly determines a second compilation value according to the compilation result signal. Here, the second compilation value includes n compilation values, and n is a positive integer.

On this basis, the first preset value may be a maximum value in the n compilation values, and the second preset value may be a minimum value in the n compilation values.

Figure 3:
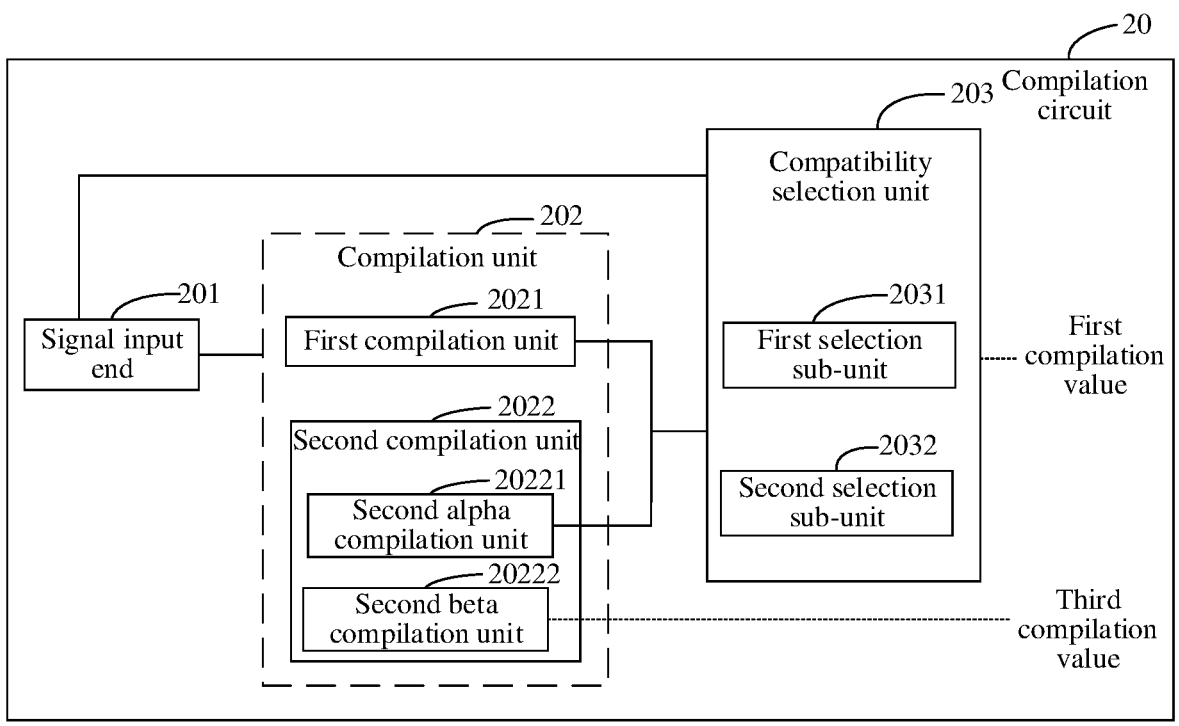
FIG. 3 is a schematic structural diagram of another compilation circuit provided by the embodiments of the disclosure.

Further, in some embodiments, as shown in FIG. 3, the compilation unit 202 includes a first compilation unit 2021 and a second compilation unit 2022.

The first compilation unit 2021 is configured to perform compilation on the signal to be compiled to obtain a first compilation result signal.

The second compilation unit 2022 is configured to perform compilation on the signal to be compiled to obtain a second compilation result signal.

It should be noted that the compilation unit 202 may be divided into a first compilation unit 2021 and a second compilation unit 2022. The first compilation unit 2021 is configured to perform compilation on a reserved code to obtain a first compilation result signal, and the second compilation unit 2022 is configured to perform compilation on a non-reserved code to obtain a second compilation result signal.

Here, since the compilation value of a reserved code is essentially determined according to the working frequency signal, the first compilation result signal only needs to indicate whether the signal to be compiled is a reserved code. Since the compilation value of a non-reserved code needs to be determined according to the specific content of the non-reserved code, the second compilation result signal needs to indicate which non-reserved code the signal to be compiled is.

Further, in some embodiments, as shown in FIG. 3, the non-reserved code includes a first-type non-reserved code, and the second compilation unit 2022 includes a second alpha compilation unit 20221.

The second alpha compilation unit 20221 is configured to perform compilation processing on the signal to be compiled to obtain a second alpha compilation result signal.

The compatibility selection unit 203 is specifically configured to, if the signal to be compiled is a first-type non-reserved code or the signal to be compiled is a reserved code, perform logical calculation on the first compilation result signal, the second alpha compilation result signal and the working frequency signal, and determine the first compilation value according to the logical calculation result.

In some embodiments, as shown in FIG. 3, the non-reserved code further includes a second-type non-reserved code, and the second compilation unit 2022 includes a second beta compilation unit 20222.

The second beta compilation unit 20222 is configured to: perform compilation processing on the signal to be compiled to obtain a second beta compilation result signal; and directly determine a third compilation value according to the second beta compilation result signal if the signal to be compiled is a second-type non-reserved code.

It should be noted that in order to save circuit area, the non-reserved code may be classified into two types: a first-type non-reserved code and a second-type non-reserved code. The first-type non-reserved code includes non-reserved codes corresponding to the above-mentioned maximum value and the above-mentioned minimum value respectively, and the second-type non-reserved code corresponds to remaining non-reserved codes other than the first-type non-reserved code.

Correspondingly, the second compilation value may be classified into a first compilation value and a third compilation value. The first compilation value includes the above-mentioned maximum value and the above-mentioned minimum value, and the third compilation value includes the rest of the second compilation values other than the first compilation value.

In this case, the compilation process of a reserved code may be combined with part of the first-type non-reserved code, so as to save the circuit area. Therefore, the second compilation unit 2022 may be divided into a second alpha compilation unit 20221 and a second beta compilation unit 20222.

For a first-type non-reserved code or a reserved code, compilation processing is performed by the first compilation unit 201 and the second alpha compilation unit 20221 to obtain a first compilation result signal and a second alpha compilation result signal, and then logical calculation is performed by the compatibility selection unit 203 on the first compilation result signal and the second alpha compilation result signal to determine a first compilation value.

For a second-type non-reserved code, compilation processing is performed by the second beta compilation unit 20222 to obtain a second beta compilation result signal, and a third compilation value is directly determined according to the second beta compilation result signal.

Further, in some embodiments, the compatibility selection unit 203 includes a first selection sub-unit 2031 and a second selection sub-unit 2032.

The first selection sub-unit 2031 is configured to determine that the first compilation value is a first preset value if the signal to be compiled is a reserved code and the working frequency signal is a low level signal, or if the signal to be compiled is a non-reserved code corresponding to the maximum value.

The second selection sub-unit 2032 is configured to determine that the first compilation value is a second preset value if the signal to be compiled is a reserved code and the working frequency signal is a high level signal, or if the signal to be compiled is a non-reserved code corresponding to the minimum value.

It should be noted that the first compilation value may include the above-mentioned maximum value and the above-mentioned minimum value. Correspondingly, the compatibility selection unit 203 includes a first selection sub-unit 2031 and a second selection sub-unit 2032.

The first selection sub-unit 2031, which is connected to the output end of the maximum value, is configured to output the maximum value if the signal to be compiled is a reserved code and the working frequency signal is a low level signal, or if the signal to be compiled is a non-reserved code corresponding to the maximum value.

The second selection sub-unit 2032, which is connected to the output end of the minimum value, is configured to output the minimum value if the signal to be compiled is a reserved code and the working frequency signal is a high level signal, or if the signal to be compiled is a non-reserved code corresponding to the minimum value.

In summary, in order to better adapt to the use of reserved codes in a DRAM in the design schemes of different DRAM controllers, the settings of six mode setting reserved codes related to speed are compiled in advance in DDR4 design, so as to further improve the compatibility of the DRAM with different system platforms.

The disclosure includes: in one aspect, the reserved codes for the six speed-related mode settings defined in DDR4 SPEC are pre-encoded during design; in another aspect, the compilation circuit includes three parts: (1) a compilation circuit for a SPEC defined code (equivalent to the above-mentioned second compilation unit); (2) a compilation circuit for a reserved code (equivalent to the above-mentioned first compilation unit); (3) a DFT selection circuit for better compatibility (equivalent to the above-mentioned compatibility selection unit 203); in yet another aspect, the above three parts of the circuit are all used to realize improved SPEC compilation truth tables (Tables 7 to 12), so the specific details of the circuit may be embodied in a variety of specific circuit structures and circuit logics; and in still another aspect, the compatibility selection circuit may targetedly match different speed application environments of controller platforms when targeting different system platforms.

The embodiments of the disclosure provide a compilation circuit. The compilation circuit includes: a signal input end configured to receive a signal to be compiled and a working frequency signal; a compilation unit configured to perform compilation processing on the signal to be compiled to obtain a compilation result signal; and a compatibility selection unit configured to, if the signal to be compiled is a reserved code, perform compatibility selection processing on the compilation result signal based on the working frequency signal to determine a first compilation value. In this way, by presetting compilation rules for reserved codes, the compatibility of a mode register with different application platforms is improved. In addition, according to different working frequency signals, the compilation results of the reserved code are different, so that the mode register can better match different encoding and speed environments.

In yet another embodiment of the disclosure, taking tCCDL setting item as an example, a specific example of a compilation circuit is provided. Referring to Table 13, a SPEC original definition table of tCCDL setting item in the some implementations is shown. Referring to Table 14, a SPEC improved definition table of tCCDL setting item in the embodiments of the disclosure is shown.

TABLE 13

| A12 | A11 | A10 | TCCD L min (nCK)¹ | TDLLK min (nCK)¹ | Note |
|---|---|---|---|---|---|
| 0 | 0 | 0 | 4 | 597 | Data rate < 1333 Mbps |
| 0 | 0 | 1 | 5 |  | 1333 Mbps < Data rate ≤ 1866 Mbps (1600/1866 Mbps) |
| 0 | 1 | 0 | 6 | 768 | 1866 Mbps < Data rate ≤ 2400 Mbps (2133/2400 Mbps) |
| 0 | 1 | 1 | 7 | 1024 | 2400 Mbps < Data rate ≤ 2666 Mbps (2666 Mbps) |
| 1 | 0 | 0 | 8 |  | 2666 Mbps < Data rate ≤ 3200 Mbps (2933/3200 Mbps) |
| 1 | 0 | 1 | Reserved |  |  |
| 1 | 1 | 0 |  |  |  |
| 1 | 1 | 1 |  |  |  |

TABLE 14

| A12 | A11 | A10 | TCCD_L TM_LF is 0, i.e., high frequency adaptive configuration | TCCD_L TM_LF is 1, i.e., low frequency adaptive configuration |
|---|---|---|---|---|
| 0 | 0 | 0 | 4 | 4 |
| 0 | 0 | 1 | 5 | 5 |
| 0 | 1 | 0 | 6 | 6 |
| 0 | 1 | 1 | 7 | 7 |
| 1 | 0 | 0 | 8 | 8 |
| 1 | 0 | 1 | 8 | 4 |
| 1 | 1 | 0 | 8 | 4 |
| 1 | 1 | 1 | 8 | 4 |

It can be seen from Table 14 that when the signal to be compiled is a reserved code, the compilation value needs to be determined according to the working frequency signal (or TM_LF signal). If the TM_LF signal is 0, it indicates that the DRAM controller is at a high frequency, and then the compilation value of the reserved code is the maximum value "8"; on the contrary, if the TM_LF signal is 1, it indicates that the DRAM controller is at a low frequency, and then the compilation value of the reserved code is the minimum value "4".

According to DDR4, tCCDL setting item is encoded by the three input bits A12, A11 and A10 of the mode register MR6. A12_T represents the signal value of A12, and A12_B represents the signal value of A12 after NOT operation. The following describes the input bit combination of tCCDL by three bit values. For example, 101 successively represents that the signal of A12 is logic 1, the signal of A11 is logic 0, and the signal of A10 is logic 1.

Figure 4:
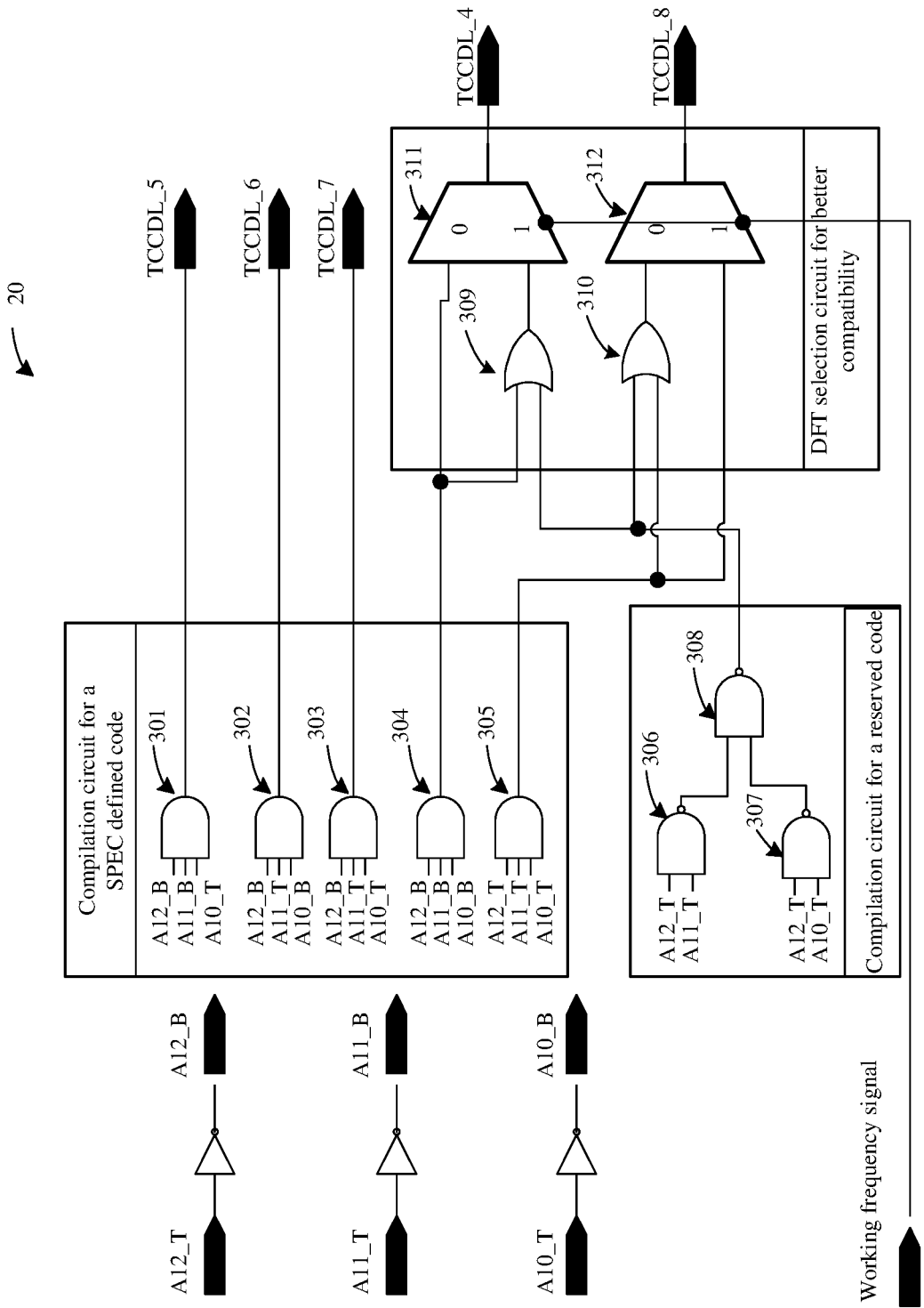
FIG. 4 is a detailed schematic structural diagram of a compilation circuit provided by the embodiments of the disclosure.

In order to implement Table 14, referring to FIG. 4, a detailed schematic structural diagram of a compilation circuit 20 provided by the embodiments of the disclosure is shown. In FIG. 4, the compilation circuit 20 includes an arithmetic unit 301, an arithmetic unit 302, an arithmetic unit 303, an arithmetic unit 304, an arithmetic unit 305, an arithmetic unit 306, an arithmetic unit 307, an arithmetic unit 308, an arithmetic unit 309, an arithmetic unit 310, a data selector 311, and a data selector 312. The arithmetic unit 301 to the arithmetic unit 305 are all three-input AND gates, the arithmetic unit 306 to the arithmetic unit 308 are all two-input NAND gates, and the arithmetic unit 309 and the arithmetic unit 310 are both OR gates. Please refer to FIG. 4 for the specific connection of the above devices, and the details are not described herein again.

As shown in FIG. 4, from a functional point of view, the compilation circuit 20 may be divided into three parts: (1) a compilation circuit for a SPEC defined code (SPEC Defined Decode Block); (2) a compilation circuit for a reserved code (SPEC Reserved Decode Block); and (3) a DFT selection circuit for better compatibility (DFT Block For Better Compatibility).

(1) The compilation circuit for a SPEC defined code (SPEC Defined Decode Block) includes an arithmetic unit 301, an arithmetic unit 302, an arithmetic unit 303, an arithmetic unit 304, and an arithmetic unit 305. The arithmetic unit 301, the arithmetic unit 302, and the arithmetic unit 303 are specifically circuits configured to perform compilation on a second-type non-reserved code, and the arithmetic unit 304 and the arithmetic unit 305 are specifically circuits configured to perform compilation on a first-type non-reserved code.

(2) The compilation circuit for a reserved code (SPEC Reserved Decode Block) includes an arithmetic unit 306, an arithmetic unit 307, and an arithmetic unit 308.

(3) The DFT selection circuit for better compatibility (DFT Block For Better Compatibility) includes an arithmetic unit 309, an arithmetic unit 310, a data selector 311, and a data selector 312.

Based on the compilation circuit in FIG. 4, the specific compilation principle is as follows.

If the signal to be compiled is a second-type non-reserved code, such as 001, the arithmetic unit 301 outputs logic 1, the output end TCCDL_5 is at a high level, other output ends are at a low level, and the final compilation value is 5.

If the signal to be compiled is a first-type reserved code, such as 000, the arithmetic unit 304 outputs logic 1, the arithmetic unit 308 outputs logic 0, and the arithmetic unit 309 outputs logic 1. In this case, both input ports of the data selector 311 are logic 1, so regardless of whether the working frequency signal is logic 1 or logic 0, the result of the one-out-of-two data selector 311 is logic 1, that is, the output end TCCDL_4 is at a high level, other output ends are at a low level, and the final compilation value is 4.

If the signal to be compiled is a reserved code, such as 101, the arithmetic unit 304 outputs logic 0, the arithmetic unit 305 outputs logic 0, the arithmetic unit 308 outputs logic 1, the arithmetic unit 309 outputs logic 1, and the arithmetic unit 310 outputs logic 1. In this case, both input ports of each of the data selector 311 and the data selector 312 include a logic 0 and a logic 1. In this case, if the working frequency signal is logic 0, the data selector 311 selects to output logic 0, the data selector 312 selects to output logic 1, the output end TCCDL_8 is at a high level, other output ends are at a low level, and the final compilation value is 8. On the contrary, if the working frequency signal is logic 1, the data selector 311 outputs logic 1, the data selector 312 outputs logic 0, the output end TCCDL_4 is at a high level, other output ends are at a low level, and the final compilation value is 4.

In particular, for the compilation circuit, FIG. 4 is only one circuit implementation method of Table 14. Due to the diversity of logic devices, a same compilation truth table can be implemented through a variety of circuit structures. The embodiments of the disclosure are not exhaustive. Therefore, as long as it conforms to the idea in the embodiments of the disclosure, that is, a reserved code is encoded and decoded in advance based on a working frequency signal, corresponding circuit structures are all within the scope of protection of the embodiments of the disclosure.

It should be noted that the application scenario of the embodiments of the disclosure generally appears in a test before delivery to a user. During use, a reserved code is generally not used for control. Therefore, before delivery to a user, the working frequency signal may be preset to a low level signal or a high level signal. Since a user will generally not send a reserved code related command, the user experience will not be affected. Of course, if the user sends a control command involving a reserved code, it can also ensure that the DRAM can perform relevant decoding and work normally.

In summary, in the embodiments of the disclosure, by presetting frequency- and speed-related reserved codes defined in different mode registers in DDR4 JEDEC SPEC, better compatibility with the BIOS settings of different DRAM controllers may be achieved.

The embodiments of the disclosure provide a compilation circuit. In this embodiment, the specific implementation methods in the foregoing embodiments are described in detail. It can be seen that by presetting compilation rules for reserved codes, a mode register can compile a reserved code sent by an application platform, so as to avoid that the mode register cannot work after receiving the reserved code. In addition, according to different working frequency signals, compilation results of the reserved code are different, so that the mode register can better match application platforms having different working frequencies, finally improving the compatibility of the mode register with different application platforms.

Figure 5:
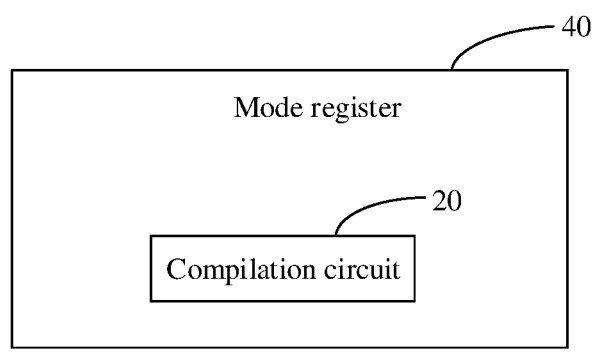
FIG. 5 is a schematic structural diagram of a mode register provided by the embodiments of the disclosure.

In another embodiment of the disclosure, referring to FIG. 5, a schematic structural diagram of a mode register 40 provided by the embodiments of the disclosure is shown. As shown in FIG. 5, the mode register 40 includes at least the above-mentioned compilation circuit 20.

Since the mode register 40 includes the above-mentioned compilation circuit 20, the mode register can compile a reserved code sent by an application platform due to the presetting of compilation rules for reserved codes, so as to avoid that the mode register cannot work after receiving the reserved code. In addition, according to different working frequency signals, compilation results of the reserved code are different, so that the mode register can better match application platforms having different working frequencies, finally improving the compatibility of the mode register with different application platforms.

Figure 6:
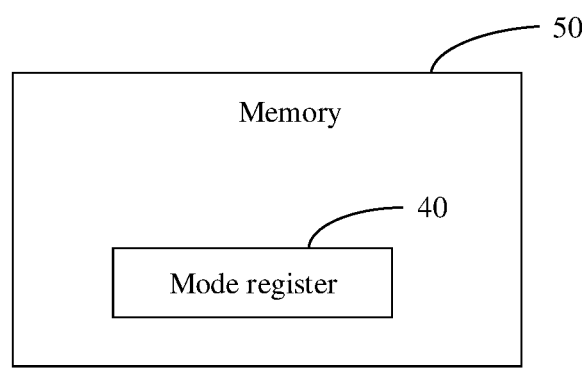
FIG. 6 is a schematic structural diagram of a memory provided by the embodiments of the disclosure.

In another embodiment of the disclosure, referring to FIG. 6, a schematic structural diagram of a memory 50 provided by the embodiments of the disclosure is shown. As shown in FIG. 6, the memory 50 includes at least the above-mentioned mode register 40.

Since the memory 50 includes the above-mentioned mode register 40, the mode register can compile a reserved code sent by an application platform due to the presetting of compilation rules for reserved codes, so as to that the memory cannot work after receiving the reserved code. In addition, according to different working frequency signals, compilation results of the reserved code are different, so that the memory can better match application platforms having different working frequencies, finally improving the compatibility of the memory with different application platforms.

Further, the memory 50 includes at least a DRAM and conforms to DDR4 memory specifications.

The above is only illustrative embodiments of the disclosure and is not used to limit the scope of protection of the disclosure.

It should be noted that in the disclosure, the terms "comprise", "include" or any other variation thereof are intended to cover non-exclusive inclusion, so that a process, method, article or apparatus including a series of elements includes not only those elements, but also other elements not explicitly listed, or elements inherent to such a process, method, article or apparatus. Without further restrictions, the element defined by the statement "including a..." does not exclude the existence of another same element in the process, method, article or apparatus including the element.

The serial numbers in the embodiments of the disclosure are only for description and do not represent the advantages and disadvantages of the embodiments.

The methods disclosed in several method embodiments provided by the disclosure can be combined arbitrarily without conflict to obtain a new method embodiment.

The features disclosed in several product embodiments provided by the disclosure can be combined arbitrarily without conflict to obtain a new product embodiment.

The features disclosed in several method or device embodiments provided by the disclosure can be combined arbitrarily without conflict to obtain a new method embodiment or device embodiment.

The above is only specific implementations of the disclosure, but the scope of protection of the disclosure is not limited to this. Any technician familiar with the technical field can easily think of changes or replacements within the technical scope disclosed in the disclosure, which shall be covered by the scope of protection of the disclosure. Therefore, the protection scope of the disclosure shall be subject to the scope of protection of the claims.

What is claimed is:

1. A compilation method, applied to a compilation circuit, comprising:
   receiving a signal to be compiled and a working frequency signal;
   performing compilation processing on the signal to be compiled to obtain a compilation result signal; and
   in a case where the signal to be compiled is a reserved code, performing compatibility selection processing on the compilation result signal based on the working frequency signal to determine a first compilation value.

2. The compilation method of claim 1, wherein performing the compatibility selection processing on the compilation result signal based on the working frequency signal to determine a first compilation value in the case where the signal to be compiled is the reserved code comprises:
   in a case where the working frequency signal is a first level signal, determining that the first compilation value is a first preset value; and
   in a case where the working frequency signal is a second level signal, determining that the first compilation value is a second preset value;
   wherein the first level signal is different from the second level signal, and the first preset value is different from the second preset value.

3. The compilation method of claim 2, wherein the first level signal is a low level signal and the second level signal is a high level signal.

4. The compilation method of claim 1, wherein in a case where the signal to be compiled is a non-reserved code, the method further comprises:
   determining a second compilation value according to the compilation result signal.

5. The compilation method of claim 4, wherein the compilation circuit comprises a first compilation unit, a second compilation unit and a compatibility selection unit, and the method further comprises:
   in a case where the signal to be compiled is a reserved code, determining, by the first compilation unit and the compatibility selection unit, the first compilation value; and
   in a case where the signal to be compiled is a non-reserved code, determining, by the second compilation unit, the second compilation value.

6. The compilation method of claim 5, wherein the second compilation value comprises n compilation values, n is a positive integer, and the method further comprises:
   selecting a maximum value from the n compilation values and determining the maximum value as a first preset value; and
   selecting a minimum value from the n compilation values and determining the minimum value as a second preset value.

7. The compilation method of claim 6, further comprising:
   determining a first-type non-reserved code and a second-type non-reserved code; wherein the first-type non-reserved code comprises a non-reserved code corresponding to the maximum value and a non-reserved code corresponding to the minimum value, the second-type non-reserved code comprises a non-reserved code corresponding to a compilation value between the maximum value and the minimum value of the n compilation values;
   correspondingly, the second compilation unit comprises a second alpha compilation unit and a second beta compilation unit, and the method further comprises:
   in a case where the signal to be compiled is the reserved code or the first-type non-reserved code, determining, by the first compilation unit, the second alpha compilation unit and the compatibility selection unit, the first compilation value; and
   in a case where the signal to be compiled is the second-type non-reserved code, determining, by the second beta compilation unit, a third compilation value, wherein the third compilation value is a remaining compilation value in the second compilation value other than the first compilation value.

8. The compilation method of claim 7, wherein determining, by the first compilation unit, the second alpha compilation unit and the compatibility selection unit, the first compilation value comprises:
   performing, by the first compilation unit, compilation processing on the signal to be compiled to obtain a first compilation processing signal;
   performing, by the second alpha compilation unit, compilation processing on the signal to be compiled to obtain a second alpha compilation processing signal; and
   performing, by the compatibility selection unit, logical calculation on the first compilation processing signal, the second alpha compilation processing signal and the working frequency signal, and determining the first compilation value according to the logical calculation result.

9. The compilation method of claim 1, wherein the reserved code at least comprises one of: a TWR&TRTP reserved code, a CAS Latency reserved code, a CS to CMD/ADDR Latency reserved code, a CRC+DM Write Command Latency reserved code, a C/AParity Latency reserved code, or a tCCDL/tDLLK reserved code.

10. A compilation circuit, comprising:
    a signal input end configured to receive a signal to be compiled and a working frequency signal;
    a compilation unit configured to perform compilation processing on the signal to be compiled to obtain a compilation result signal; and
    a compatibility selection unit configured to, in a case where the signal to be compiled is a reserved code, perform compatibility selection processing on the compilation result signal based on the working frequency signal to determine a first compilation value.

11. The compilation circuit of claim 10, wherein the compatibility selection unit is specifically configured to:
    in a case where the signal to be compiled is a reserved code and the working frequency signal is a first level signal, determine that the first compilation value is a first preset value; and
    in a case where the signal to be compiled is a reserved code and the working frequency signal is a second level signal, determine that the first compilation value is a second preset value;
    wherein the first level signal is different from the second level signal, and the first preset value is different from the second preset value.

12. The compilation circuit of claim 11, wherein the first level signal is a low level signal and the second level signal is a high level signal.

13. The compilation circuit of claim 11, wherein the compilation circuit is further configured to, in a case where the signal to be compiled is a non-reserved code, determine a second compilation value according to the compilation result signal; wherein the second compilation value comprises n compilation values, and n is a positive integer.

14. The compilation circuit of claim 13, wherein the compilation unit comprises a first compilation unit and a second compilation unit;
  the first compilation unit is configured to perform compilation on the signal to be compiled to obtain a first compilation result signal;
  the second compilation unit is configured to perform compilation on the signal to be compiled to obtain a second compilation result signal.

15. The compilation circuit of claim 14, wherein the first preset value is a maximum value in the n compilation values, and the second preset value is a minimum value in the n compilation values.

16. The compilation circuit of claim 15, wherein the non-reserved code comprises a first-type non-reserved code, and the second compilation unit comprises a second alpha compilation unit;
  the second alpha compilation unit is configured to perform compilation processing on the signal to be compiled to obtain a second alpha compilation result signal;
  the compatibility selection unit is specifically configured to, in a case where the signal to be compiled is the first-type non-reserved code or the signal to be compiled is the reserved code, perform logical calculation on the first compilation result signal, the second alpha compilation result signal and the working frequency signal, and determine the first compilation value according to the logical calculation result;
  the first-type non-reserved code comprises a non-reserved code corresponding to the maximum value and a non-reserved code corresponding to the minimum value of the n compilation values.

17. The compilation circuit of claim 16, wherein the non-reserved code further comprises a second-type non-reserved code, and the second compilation unit comprises a second beta compilation unit;
  the second beta compilation unit is configured to perform compilation processing on the signal to be compiled to obtain a second beta compilation result signal, and in a case where the signal to be compiled is a second-type non-reserved code, directly determine a third compilation value according to the second beta compilation result signal;
  wherein the second-type non-reserved code comprises a non-reserved code corresponding to a compilation value between the maximum value and the minimum value of the n compilation values, and the third compilation value is a remaining compilation value in the second compilation value other than the first compilation value.

18. The compilation circuit of claim 16, wherein the compatibility selection unit comprises a first selection sub-unit and a second selection sub-unit;
  the first selection sub-unit is configured to, in a case where the signal to be compiled is a reserved code and the working frequency signal is a low level signal or in a case where the signal to be compiled is the non-reserved code corresponding to the maximum value, determine that the first compilation value is the first preset value;
  the second selection sub-unit is configured to, in a case where the signal to be compiled is a reserved code and the working frequency signal is a high level signal or in a case where the signal to be compiled is the non-reserved code corresponding to the minimum value, determine that the first compilation value is the second preset value.

19. The compilation circuit of claim 10, wherein the reserved code at least comprises one of: a TWR&TRTP reserved code, a CAS Latency reserved code, a CS to CMD/ADDR Latency reserved code, a CRC+DM Write Command Latency reserved code, a C/AParity Latency reserved code, or a tCCDL/tDLLK reserved code.

20. A memory, comprising a compilation circuit,
  wherein the compilation circuit comprises:
  a signal input end configured to receive a signal to be compiled and a working frequency signal;
  a compilation unit configured to perform compilation processing on the signal to be compiled to obtain a compilation result signal; and
  a compatibility selection unit configured to, in a case where the signal to be compiled is a reserved code, perform compatibility selection processing on the compilation result signal based on the working frequency signal to determine a first compilation value.

* * * * *